United States Patent
Seo

(10) Patent No.: US 7,148,117 B2
(45) Date of Patent: Dec. 12, 2006

(54) METHODS FOR FORMING SHALLOW TRENCH ISOLATION STRUCTURES IN SEMICONDUCTOR DEVICES

(75) Inventor: Young Hun Seo, Bucheon-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 41 days.

(21) Appl. No.: 11/026,232

(22) Filed: Dec. 29, 2004

(65) Prior Publication Data

US 2005/0142802 A1  Jun. 30, 2005

(30) Foreign Application Priority Data

Dec. 31, 2003  (KR)  .................... 10-2003-0101970

(51) Int. Cl.
*H01L 21/20* (2006.01)
(52) U.S. Cl. .................... 438/389; 438/387; 438/386; 257/E21.545
(58) Field of Classification Search ........... 438/424, 438/401
See application file for complete search history.

(56) References Cited

U.S. PATENT DOCUMENTS

| | | | |
|---|---|---|---|
| 5,913,113 A * | 6/1999 | Seo | 438/166 |
| 6,420,770 B1 | 7/2002 | Xiang et al. | 257/506 |
| 6,777,336 B1 | 8/2004 | Lin et al. | 438/691 |
| 6,784,077 B1 | 8/2004 | Lin et al. | 438/426 |
| 2002/0119666 A1 * | 8/2002 | Kim et al. | 438/704 |

* cited by examiner

*Primary Examiner*—Michael Lebentritt
*Assistant Examiner*—Elias Ullah
(74) *Attorney, Agent, or Firm*—Saliwanchik, Lloyd & Saliwanchik

(57) ABSTRACT

Methods for forming STI structures in semiconductor devices are disclosed. A disclosed method comprises: forming a buffer oxide layer on a silicon substrate; implanting ions into the entire surface of the resulting structure and removing the buffer oxide layer; depositing a gate oxide layer, a polysilicon layer and a nitride layer, forming a photoresist pattern; forming the trench of the STI structure by perform an etching process using the photoresist pattern as an etching mask; forming a thin oxide layer inside the trench and on the nitride layer on the entire surface of the resulting structure; filling the trench with an insulating layer; planarizing the insulating layer by performing a CMP process using the nitride layer as an etching stop layer; performing a recessing process to etch the planarized insulating layer and the thin oxide layer on the trench to a predetermined depth; forming a photoresist pattern on the nitride layer; and forming the gate electrodes by performing an etching process using the photoresist pattern as a mask pattern.

3 Claims, 5 Drawing Sheets

METHODS FOR FORMING SHALLOW TRENCH ISOLATION STRUCTURES IN SEMICONDUCTOR DEVICES

FIELD OF THE DISCLOSURE

The present disclosure relates generally to shallow trench isolation (hereinafter referred to as "STI") structure formation and, more particularly, to methods for forming shallow trench isolation structures in semiconductor devices while preventing the occurrence of dents on the upper part of the STI structure.

BACKGROUND

A LOCOS process has been widely employed to form prior art device isolation structures. However, the prior art device isolation structures formed by the LOCOS process have several shortcomings such as, for example, the well-known problem of bird's-beak formations. Accordingly, various methods have been suggested to solve such problems in the prior art LOCOS process. One popular method is to form an STI structure as the device isolation structure. In brief, the conventional STI structure formation method comprises: forming a trench in a substrate by etching a field area to a depth of 3000 Å, filling a predetermined material into the trench by using high density plasma, and planarizing the surface of the resulting structure by a chemical mechanical polishing (hereinafter referred to as "CMP") process.

FIGS. 1a through 1d are cross-sectional views illustrating a prior art process for forming an STI structure. Referring to FIG. 1a, a pad oxide layer 11 is grown on a silicon substrate 10. Subsequently, a pad nitride layer 12 is formed on the pad oxide layer 11. Both the pad oxide layer 11 and the pad nitride layer 12 function as buffer layers in the later etching process. A photoresist is then provided on the pad nitride layer 12 and patterned to expose the pad nitride layer 12.

Referring to FIG. 1b, the exposed part of the pad nitride layer 12, the pad oxide layer 11, and the silicon substrate 10 are then etched to a predetermined depth using the photoresist as an etching mask.

Referring to FIG. 1c, the trench is filled with an oxide layer 14 made of tetraethoxysilane (TEOS) which has a good step coverage characteristic.

Referring to FIG. 1d, a planarization process is performed to remove the pad nitride layer 12 and the pad oxide layer 11, thereby completing an STI structure 15.

However, in the prior art STI structure formation process, until a gate electrode is formed on the resulting structure, the formed STI structure is continuously exposed to etching environments. Thus, some parts of the STI structure are gradually and unintentionally etched by later etching processes. In particular, the oxide layer on the edges of the STI structure is easily etched due to its high activation energy. As a result, the top of the STI structure suffers from defects such as dents.

DETAILED DESCRIPTION

Figure 1A:
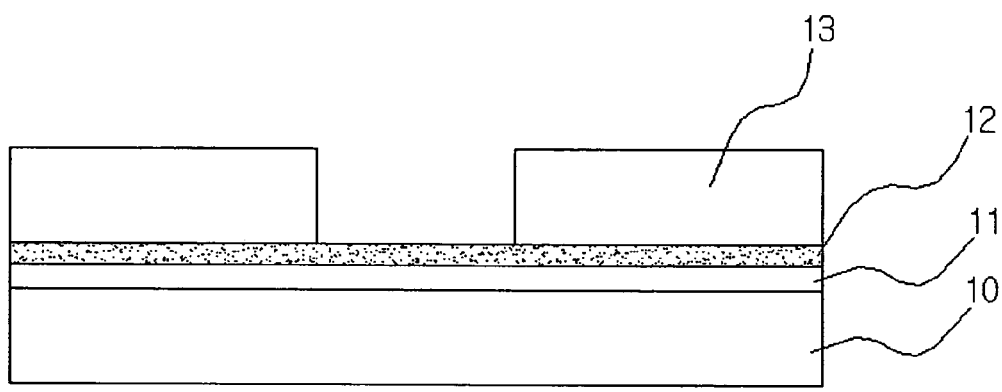
FIGS. 1a through 1d are cross-sectional views illustrating a prior art process for forming an STI structure.
Figure 1B:
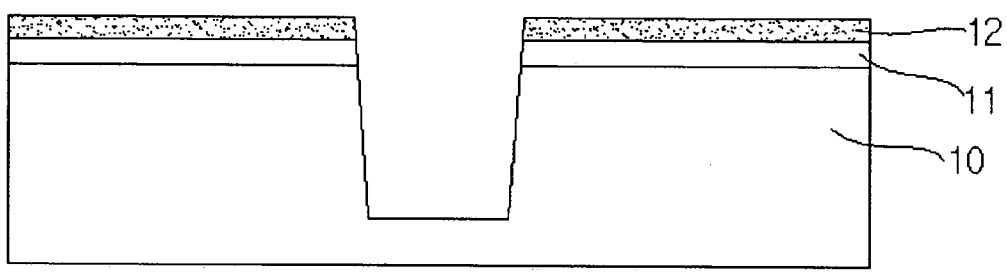
Figure 1C:
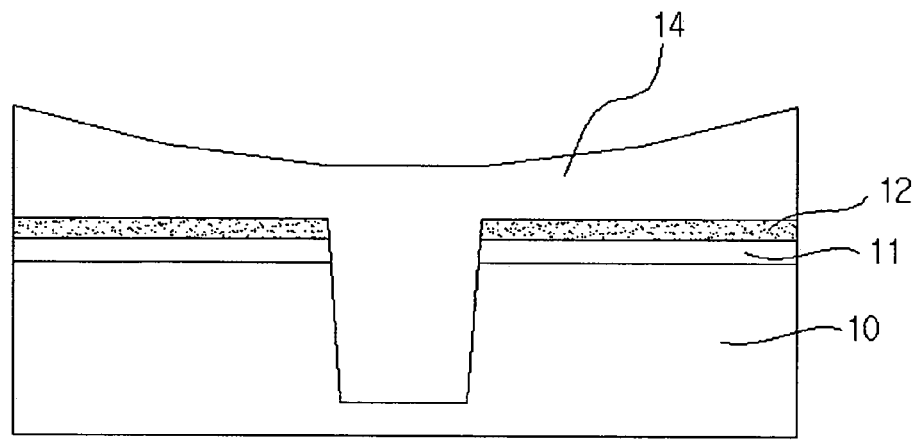
Figure 1D:
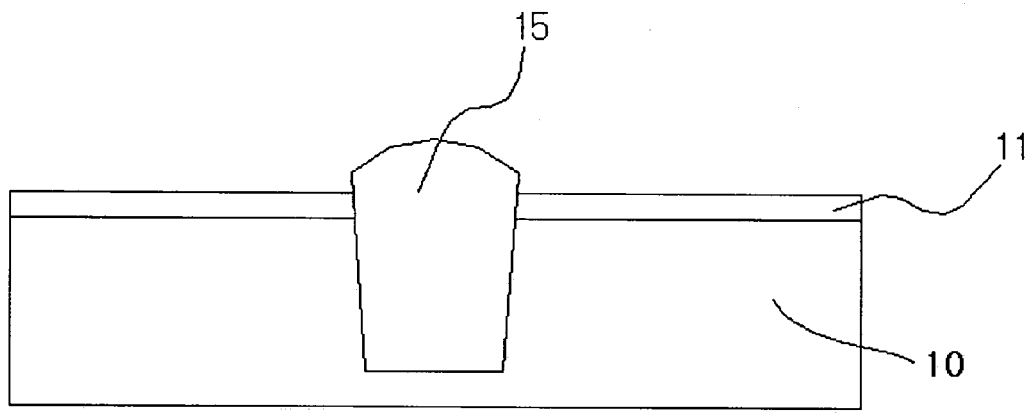
Figure 2A:
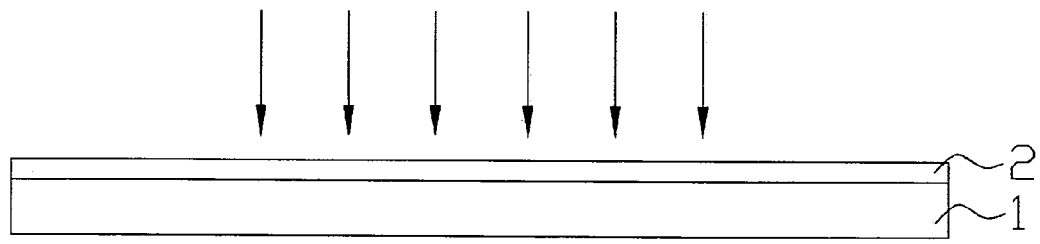
FIGS. 2a through 2f are cross sectional views illustrating an example process for forming an STI structure performed in accordance with the teachings of the present invention.

FIGS. 2a through 2f are cross sectional views illustrating an example process for forming an STI structure performed in accordance with teachings of the present invention. Referring to FIG. 2a, a buffer oxide layer 2 is formed on a silicon substrate 1. Ions are then implanted to define a channel (not shown) and well regions (not shown). Before the ion implantation processes, a key pattern (not shown) may be formed to align the channel and the well regions with a pattern for forming an STI structure (not shown). The buffer layer 2 is then removed to expose the entire surface of the silicon substrate 1.

Figure 2B:
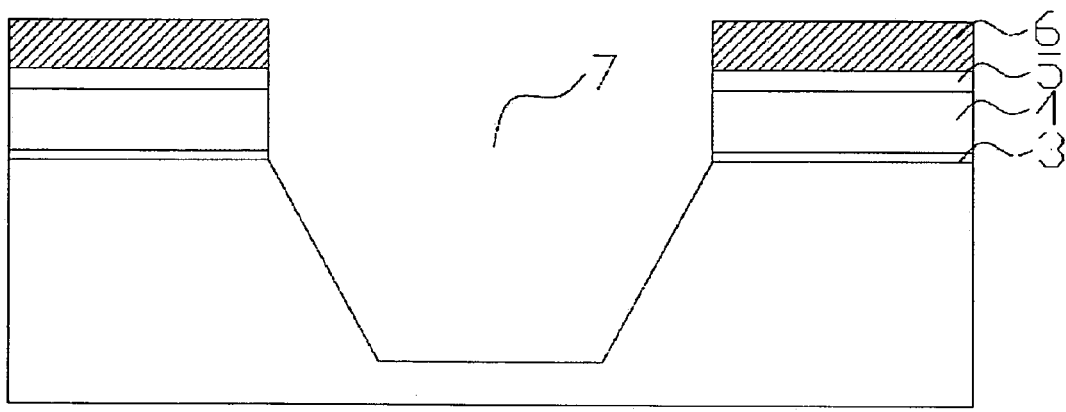

Referring to FIG. 2b, a gate oxide layer 3, a polysilicon layer 4 to form gate electrodes, and a nitride layer 5 are sequentially formed on the silicon substrate 1. Subsequently, a photoresist pattern 6 is formed on the nitride layer 5 by a photolithography process. The pattern 6 is used to form the trench of the STI structure. In particular, an etching process is performed to form the trench of the STI structure while using the photoresist pattern 6 as a mask. Because the gate oxide layer 3 and the polysilicon layer 4 are formed before or while the STI structure is completed, the number of occurrences of later etching processes decreases. Therefore, damage on the top of the STI structure can be effectively and efficiently reduced.

Figure 2C:
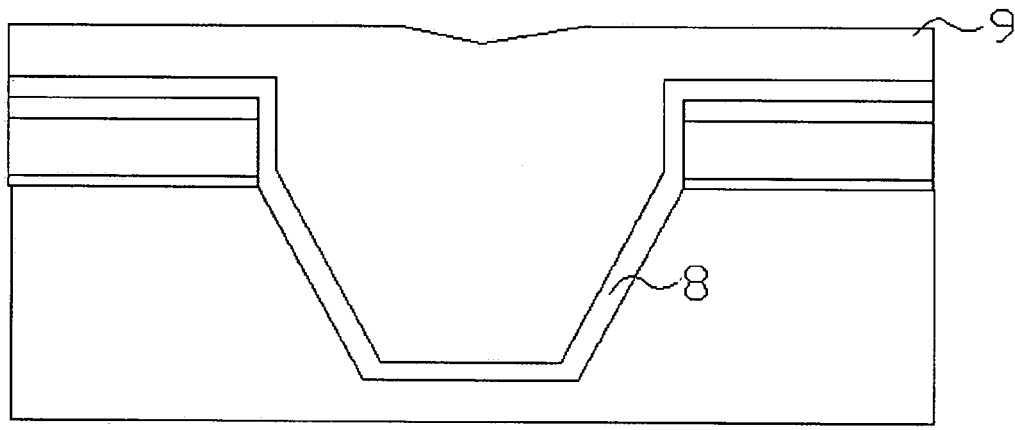

Referring to FIG. 2c, a liner oxide layer 8 is formed inside the trench and on the entire surface of the nitride layer 5. Subsequently, an insulating layer 9 is filled into the trench and is deposited on the liner oxide layer 8 of the resulting structure.

Figure 2D:
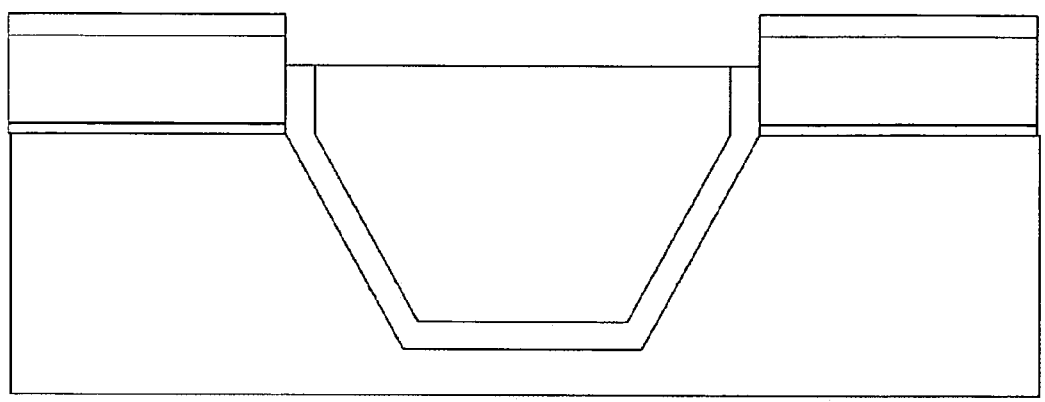

Referring to FIG. 2d, a CMP process is performed to planarize the insulating layer 9 and the liner oxide layer 8 using the nitride layer 5 as an etching stop layer. Subsequently, a predetermined recessing process is performed to etch the planarized insulating layer 9 and the liner oxide layer in the trench to a predetermined depth. The etching depth of the recessing process may affect the margins of later etching processes for forming contacts. Therefore, an optimum etching depth should be determined before the recessing process is performed.

Figure 2E:
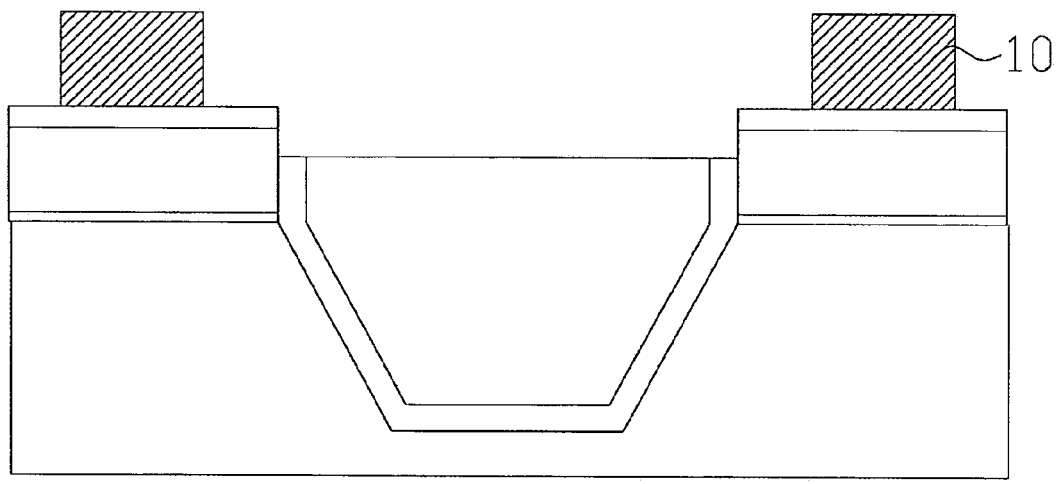

Referring to FIG. 2e, another photoresist pattern 10 for forming the gate electrodes is formed on the nitride layer 5.

Figure 2F:
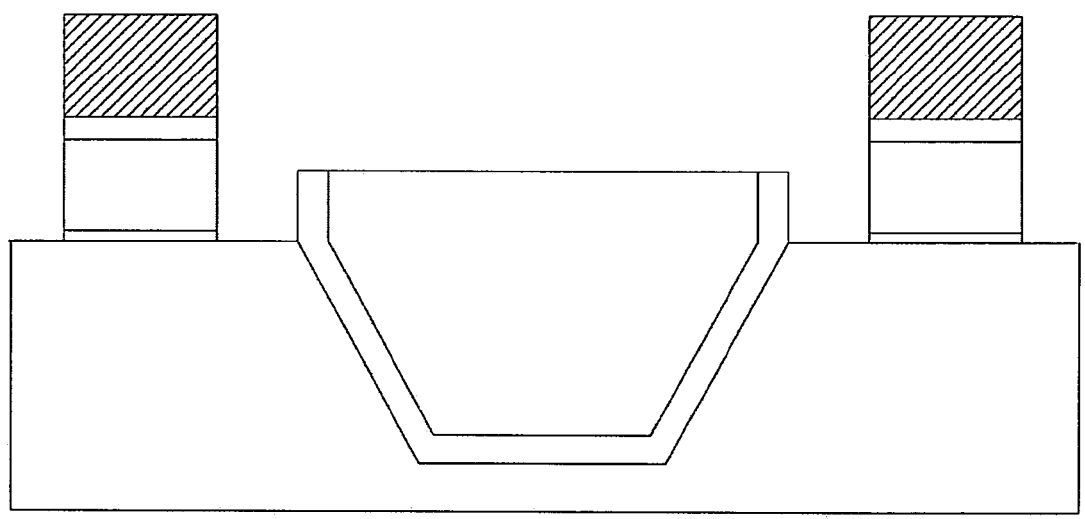

Referring to FIG. 2f, the gate electrodes are formed by performing an etching process using the photoresist pattern 10 as an etching mask.

Conventional transistor fabrication processes are then performed in a well known manner to complete the fabrication process.

In view of the foregoing, persons of ordinary skill in the art will appreciate that the above-disclosed methods can prevent the occurrence of dents on the upper surface of an STI structure by forming a gate oxide layer and a polysilicon layer before or while the STI structure is completed.

It is noted that this patent claims priority from Korean Patent Application Serial Number 10-2003-0101970, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming an STI structure comprising:
forming a buffer oxide layer on a silicon substrate;
implanting ions into the substrate;
removing the buffer oxide layer;
depositing a gate oxide layer, a polysilicon layer and a nitride layer;
forming a photoresist pattern on the nitride layer;
performing an etching process of the nitride layer, polysilicon layer, gate oxide layer, and the substrate using the photoresist pattern as an etching mask to form the trench for the STI structure;
forming a liner oxide layer inside the trench;
filling the trench with an insulating layer;
performing a CMP process using the nitride layer as an etching stop layer to planarize the insulating layer and the liner oxide layer;
performing a recessing process to etch the planarized insulating layer and the liner oxide layer in the trench to a predetermined depth;
forming a second photoresist pattern on the nitride layer; and
performing an etching process using the second photoresist pattern as a mask pattern to form the gate electrodes.

2. A method as defined in claim 1, wherein implanting the ions forms a channel and well regions.

3. A method as defined in claim 1, further comprising forming a key pattern before the buffer layer is removed and after forming the buffer oxide layer.

* * * * *